(12) United States Patent
Cooke et al.

(10) Patent No.: US 10,175,133 B2
(45) Date of Patent: Jan. 8, 2019

(54) SENSOR WITH PROTECTIVE LAYER

(71) Applicant: Entegris, Inc., Billerica, MA (US)

(72) Inventors: Richard A. Cooke, Framingham, MA (US); George Gonnella, Pepperell, MA (US); Sung In Moon, Chaska, MN (US); Charles W. Extrand, Minneapolis, MN (US); John E. Pillion, Hollis, NH (US)

(73) Assignee: Entegris, Inc., Billerica, MA (US)

( * ) Notice: Subject to any disclaimer, the term of this patent is extended or adjusted under 35 U.S.C. 154(b) by 413 days.

(21) Appl. No.: 14/890,752

(22) PCT Filed: Jun. 4, 2014

(86) PCT No.: PCT/US2014/040904
§ 371 (c)(1),
(2) Date: Nov. 12, 2015

(87) PCT Pub. No.: WO2014/197590
PCT Pub. Date: Dec. 11, 2014

(65) Prior Publication Data
US 2016/0103033 A1    Apr. 14, 2016

Related U.S. Application Data

(60) Provisional application No. 61/832,382, filed on Jun. 7, 2013, provisional application No. 61/836,390, filed (Continued)

(51) Int. Cl.
*G01L 19/06* (2006.01)
*B81B 7/00* (2006.01)

(52) U.S. Cl.
CPC ........ *G01L 19/0645* (2013.01); *B81B 7/0025* (2013.01)

(58) Field of Classification Search
CPC ............ G01L 19/0627; G01L 19/0645; B81B 7/0025; G01N 21/09
See application file for complete search history.

(56) References Cited

U.S. PATENT DOCUMENTS 5,629,538 A * 5/1997 Lipphardt ............ G01L 9/0042
257/254
5,693,887 A 12/1997 Englund et al.
(Continued)

FOREIGN PATENT DOCUMENTS

DE 44 15 984 A1 11/1995
JP 63-307347 12/1988
(Continued)

OTHER PUBLICATIONS

Notification of Transmittal of the International Search Report and The Written Opinion of the International Searching Authority for International Application No. PCT/US2014/040904; "Sensor With Protective Layer"; dated Jan. 30, 2015.
(Continued)

*Primary Examiner* — Freddie Kirkland, III
(74) *Attorney, Agent, or Firm* — Entegris, Inc.

(57) ABSTRACT

A sensor comprises a sensor layer comprising a ceramic material; an adhesion layer comprising chromium, the adhesion layer adhered to one or more portions of a liquid facing surface of the sensor layer; and an isolator film comprising a polymer, the isolator film overlaying a liquid facing surface of the adhesion layer. The isolator film may be used to protect the sensor from corrosive and high temperature fluids, for example to protect the sensor from long term exposure to hot water between 85° C. and 100° C.

29 Claims, 12 Drawing Sheets

Related U.S. Application Data on Jun. 18, 2013, provisional application No. 61/869,417, filed on Aug. 23, 2013.

(56) References Cited

U.S. PATENT DOCUMENTS

| | | | |
|---|---|---|---|
| 5,869,766 | A | 2/1999 | Cucci et al. |
| 6,326,563 | B1 | 12/2001 | Takeuchi et al. |
| 6,357,278 | B1 | 3/2002 | Sivavec et al. |
| 6,474,169 | B1 | 11/2002 | Aizawa et al. |
| 6,612,175 | B1 | 9/2003 | Peterson et al. |
| 6,640,639 | B2 | 11/2003 | Okawa |
| 7,159,465 | B2 | 1/2007 | Aizawa |
| 7,240,557 | B2 * | 7/2007 | Muller ............... B29C 63/0065 73/706 |
| 7,389,689 | B2 | 6/2008 | Wargo et al. |
| 8,460,961 | B2 * | 6/2013 | Guo ..................... C23C 14/021 257/E21.533 |
| 2004/0200287 | A1 * | 10/2004 | Mueller ............. B29C 63/0065 73/715 |
| 2005/0139009 | A1 | 6/2005 | Flogel et al. |
| 2007/0013014 | A1 * | 1/2007 | Guo ..................... C23C 14/021 257/417 |
| 2007/0170812 | A1 | 7/2007 | Fani et al. |
| 2016/0103033 | A1 | 4/2016 | Cooke et al. |

FOREIGN PATENT DOCUMENTS

| | | |
|---|---|---|
| JP | H05-5664 A | 1/1993 |
| JP | 2002-022589 A | 1/2002 |
| JP | 2004-191137 A | 7/2004 |
| JP | 2005-028784 A | 2/2005 |
| JP | 2005-513469 A | 5/2005 |
| JP | 2007-109825 A | 4/2007 |
| JP | 2008-008712 A | 1/2008 |
| JP | 2010-284897 A | 12/2010 |
| JP | 2012-137435 | 7/2012 |
| TW | 200900665 A | 1/2009 |
| WO | 2014/197590 | 12/2014 |

OTHER PUBLICATIONS

Notification Concerning Transmittal of International Preliminary Report on Patentability for International Application No. PCT/US2014/040904; "Sensor With Protective Layer"; dated Dec. 17, 2015.
Chemistry Stack Exchange, "Is there Any Chemical that can destroy PTFE, or Teflon?", http://chemistry.stackexchange.com/questions/34190/is-there-any-chemical-that-can-destroy-ptfe-or-teflon, May 15, 2018.
"Plas-Tech Coatings", WebArchive, http://www.plastechcoatings.com/dupont_teflon_coating.html, Jul. 4, 2008.
Wikipedia, "Polytetrafluoroethylene", https://en.wikipedia.org/wiki/Polytetrafluoroethylene, May 17, 2018.

* cited by examiner

SENSOR WITH PROTECTIVE LAYER

RELATED APPLICATIONS

This application is the U.S. National Stage of International Application No.: PCT/US2014/040904 filed on Jun. 4, 2014 which designates the U.S., published in English and claims the benefit of U.S. Provisional Application No. 61/832,382, filed on Jun. 7, 2013; and claims the benefit of U.S. Provisional Application No. 61/836,390, filed on Jun. 18, 2013; and claims the benefit of U.S. Provisional Application No. 61/869,417, filed on Aug. 23, 2013. The entire teachings of the above applications are incorporated herein by reference.

BACKGROUND OF THE INVENTION

Pressure sensors are used widely in semiconductor manufacturing to measure pressure and flow of liquid chemicals. An Integrated Flow Controller (IFC), for example, has two such sensors. These sensors often must be isolated from the liquid chemicals to protect the sensors from corrosion and to protect the chemical from contamination. In the past, the sensor isolation has been accomplished by placing a loose fluoropolymer film between the sensors and the chemicals. Over time, exposure to heat and vacuum can cause permanent deformation of the isolator film, which in turn affects sensor performance.

Adhesives have also been used to secure an isolator film to a sensor. However, it has been observed that when the isolator film is exposed to hot deionized water for an extended period of time, bubbles or blisters can form under the isolator film and delamination of the film from the sensor can occur.

There is a continuing need for isolator films to protect sensors from corrosive and high temperature fluids, for example long term exposure to hot water between 85° C. and 100° C.

SUMMARY OF THE INVENTION

In one version of the invention, there is provided a sensor comprising a sensor layer comprising a ceramic material; an adhesion layer comprising chromium, the adhesion layer adhered to one or more portions of a liquid facing surface of the sensor layer; and an isolator film comprising a polymer, one or more portions of the isolator film being bonded to a liquid facing surface of the adhesion layer.

In further, related versions, the adhesion layer may comprise at least one of a chromium alloy and chromium oxide. The adhesion layer may comprise a chromium platinum alloy. The adhesion layer may comprise chromium of a purity of at least 99.9%. The adhesion layer may comprise a thickness of between about 10 nanometers (nm) and about 2 microns; such as a thickness of between about 30 nanometers (nm) and about 60 nanometers (nm). The adhesion layer may comprise a physical vapor deposition deposited layer. The adhesion layer may be at least one of affixed and bonded to the liquid facing surface of the sensor layer. The ceramic material may comprise alumina, such as between about 93% and about 96% alumina, or between about 96% alumina and about 99.8% alumina. The isolator film may comprise a fluoropolymer; such as at least one of at least one of perfluoroalkoxy (PFA), fluorinated ethylene propylene (FEP), polytetrafluoroethylene (PTFE) and polychlorotrifluoroethylene (PCTFE). The isolator film may comprise at least one of a laminated fluoropolymer film, an injected molded fluoropolymer film, and a sprayed and sintered fluoropolymer film. The isolator film may comprise a thickness of between about 0.001 inches and about 0.005 inches, such as a thickness of less than about 0.001 inches.

In other related versions, the sensor may comprise at least one of a liquid pressure sensor, a flow sensor and a viscosity sensor; and may comprise a sensor for deionized water at a temperature between about 85° C. and about 100° C. The bond between the isolator film and the adhesion layer may be characterized by no visible blisters being formed between the isolator film and the adhesion layer after exposing the sensor sealed in a housing to hot deionized water at a temperature of between 85° C. and 100° C. for at least 3 weeks. One or more portions of the isolator film may be bonded to the adhesion layer by thermal lamination, such as at a temperature greater than about 300 C for at least about 10 minutes. One or more portions of the isolator film may be bonded to the adhesion layer by thermal lamination followed by cooling for at least about 30 minutes.

In further related versions, at least a portion of the isolator film may be infiltrated into microstructure openings in a surface of the adhesion layer. One or more portions of the isolator film may be bonded to the adhesion layer by laser welding. The sensor may further comprise a porous polymeric material between the isolator film and the adhesion layer. The sensor may further comprise an adhesive bonding the isolator film to the porous polymeric material. The sensor may further include one or more vent pathways that vent gas or vapor from the sensor; and may include one or more vent pathways between the isolator film and the adhesion layer. The adhesion layer may comprise a surface roughness of greater than about 0.7 micrometers roughness average (Ra) and greater than about 0.8 micrometers roughness root mean squared (rms) prior to application of the isolator film.

While several exemplary articles, compositions, apparatus, and methods embodying aspects of the present invention have been shown, it will be understood, of course, that the invention is not limited to these versions. Modification may be made by those skilled in the art, particularly in light of the foregoing teachings. For example, components and features of one version may be substituted for corresponding components and features of another version. Further, the invention may include various aspects of these versions in any combination or sub-combination.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

Figure 1:
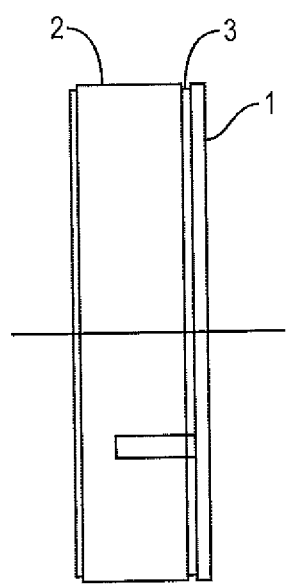
FIG. 1 is a diagram of a sensor in accordance with a version of the invention.

While this invention has been particularly shown and described with references to example embodiments thereof, it will be understood by those skilled in the art that various changes in form and details may be made therein without departing from the scope of the invention encompassed by the appended claims.

While various compositions and methods are described, it is to be understood that this invention is not limited to the particular molecules, compositions, designs, methodologies or protocols described, as these may vary. It is also to be understood that the terminology used in the description is for the purpose of describing the particular versions or versions only, and is not intended to limit the scope of the present invention which will be limited only by the appended claims.

It must also be noted that as used herein and in the appended claims, the singular forms "a", "an", and "the" include plural reference unless the context clearly dictates otherwise. Thus, for example, reference to a "fluoropolymer" is a reference to one or more fluoropolymers and equivalents thereof known to those skilled in the art, and so forth. Unless defined otherwise, all technical and scientific terms used herein have the same meanings as commonly understood by one of ordinary skill in the art. Methods and materials similar or equivalent to those described herein can be used in the practice or testing of versions of the present invention. All publications mentioned herein are incorporated by reference in their entirety. Nothing herein is to be construed as an admission that the invention is not entitled to antedate such disclosure by virtue of prior invention. "Optional" or "optionally" means that the subsequently described event or circumstance may or may not occur, and that the description includes instances where the event occurs and instances where it does not. All numeric values herein can be modified by the term "about," whether or not explicitly indicated. The term "about" generally refers to a range of numbers that one of skill in the art would consider equivalent to the recited value (i.e., having the same function or result). In some versions the term "about" refers to ±10% of the stated value, in other versions the term "about" refers to ±2% of the stated value. While compositions and methods are described in terms of "comprising" various components or steps (interpreted as meaning "including, but not limited to"), the compositions and methods can also "consist essentially of" or "consist of" the various components and steps, such terminology should be interpreted as defining essentially closed-member groups.

Without wishing to be bound by theory, it is thought that hot water between 85° C. and 100° C. permeates through an isolator film over an alumina sensor and attacks (hydrolyzes) the surface of the alumina sensors, thereby weakening the adhesion between the isolator film and the alumina sensor surface, and thereby causing delamination of the isolator film. It is believed that this mode of failure can also occur with other ceramic substrates that could be used for sensors in general.

One version of the invention that prevents delamination and/or deformation of a polymeric isolator film bonded to a ceramic sensor during extended exposure to hot water between 85° C. and 100° C., is a sensor that has an adhesion layer between the ceramic sensor's liquid facing surface and the polymeric isolator atop the ceramic sensor's liquid facing surface. Another version of the invention that prevents delamination and/or deformation of a polymeric isolator film bonded to a ceramic sensor during extended exposure to hot water between 85° C. and 100° C. is a sensor that has a polymeric isolator bonded to the ceramic sensor's liquid facing surface that has one or more pathways for permeated vapor to be ventilated from between the ceramic sensor and the bonded isolator film. In still yet other versions of the invention that prevent delamination and or deformation of a polymeric isolator film bonded to a ceramic sensor during extended exposure to hot water between 85° C. and 100° C., there is provided a sensor that has an adhesion layer between the ceramic sensor's liquid facing surface and the polymeric isolator atop the ceramic sensor's liquid facing surface and includes one or more pathways for permeated vapor to be ventilated from between the ceramic sensor and the bonded isolator film.

In accordance with a version of the invention, the combination of a physical vapor deposition deposited chromium coating on an alumina sensor, with an overlaying laminated fluoropolymer film such as FEP, PTFE, PCTFE or PFA, provides a stable, long lasting, low metals barrier to a pressure sensor.

FIG. 1 is a diagram of a sensor in accordance with a version of the invention. A sensor layer 2 comprising a ceramic material is coated with an adhesion layer 3 comprising chromium. The chromium adhesion layer 3 is an effective barrier to water and an adhesion promoter for an isolator film 1. The isolator film 1, comprising a polymer, which may be a fluoropolymer film, such as, but not limited to, FEP, PTFE, PCTFE or PFA, overlays the liquid facing surface of the adhesion layer 3. For example, the isolator film 1 may be laminated directly to the liquid contacting face of the adhesion layer 3, or bonded by other techniques taught herein, including adhesive bonding. The isolator film 1 may, for example, be between about 0.001 and about 0.005 inches thick, in particular less than about 0.001 inches thick. The isolator film 1 may have a roughness of less than about 2 microns. The sensor layer 2 can be a ceramic material. For example, the ceramic sensor layer 2 can be comprised of alumina or sapphire, as well as ceramics like titanium dioxide, iridium oxide, $SnO_2$, perovskites, yttrium oxide and $SrTiO_3$. The sensor may be a ceramic sensor, such as a low alumina sensor, for example a sensor with between about 93% and about 96% alumina, or such as a high alumina sensor, for example a sensor with between about 96% alumina and about 99.8% alumina. Sensors may be used with hot deionized water, such as between about 85° C. and 100° C., and may be used with semiconductor manufacturing liquids; as liquid pressure sensors; as flow sensors; and/or as viscosity sensors.

In one version, the chromium adhesion layer 3 may include chromium, such as chromium of at least about 99.9% purity, and/or may include chromium oxide, such as in a surface layer, and/or may include a chromium alloy, such as chromium platinum alloy. The chromium adhesion layer 3 may, for example, be between about 100 Angstroms (10 nanometers) thick and about 2 microns thick. For example, the chromium adhesion layer 3 may comprise a thickness of between about 30 nanometers (nm) and about 60 nanometers (nm). The chromium adhesion layer 3 is adhered to the liquid facing surface of the sensor, and may be affixed or bonded to the liquid facing surface of the sensor.

In one version, the isolator film 1 is bonded to the liquid facing surface of the adhesion layer 3, the bond between the isolator film 1 and the adhesion layer 3 being characterized by no visible blisters being formed between the isolator film 1 and the adhesion layer 3 after exposing the sensor to hot deionized water between 85° C. and 100° C. for at least 3 weeks; and/or by the isolator film 1 remaining transparent under such conditions for at least 3 weeks.

In one version of the sensor the polymeric isolator film 1 is bonded directly to the ceramic sensor layer 2, or alternatively, directly to an adhesion layer 3. The bonding can be achieved using a laser. Portions of the isolator film 1 may be left unbonded to create pathways for the vapor to be vented. A porous material may be positioned between the polymeric isolator film 1 and the ceramic sensor and bonded to either or both.

In one version of the invention a porous material is positioned between the non-porous or dense polymeric isolator film 1 and the adhesion layer 3 overlaying the liquid facing side of the ceramic sensor layer 2. The porous material can provide one or more pathways, for example pores, that allow vapor permeating through the polymeric isolator film 1 to be vented to a tube or weep hole in the sensor housing. The porous material can be a porous polymeric material such as a microporous polymeric membrane. Selective bonding of the non-porous film and the porous film to each other and the adhesion layer can also be used to provide ventilation paths for chemical permeates to escape.

Figure 2:
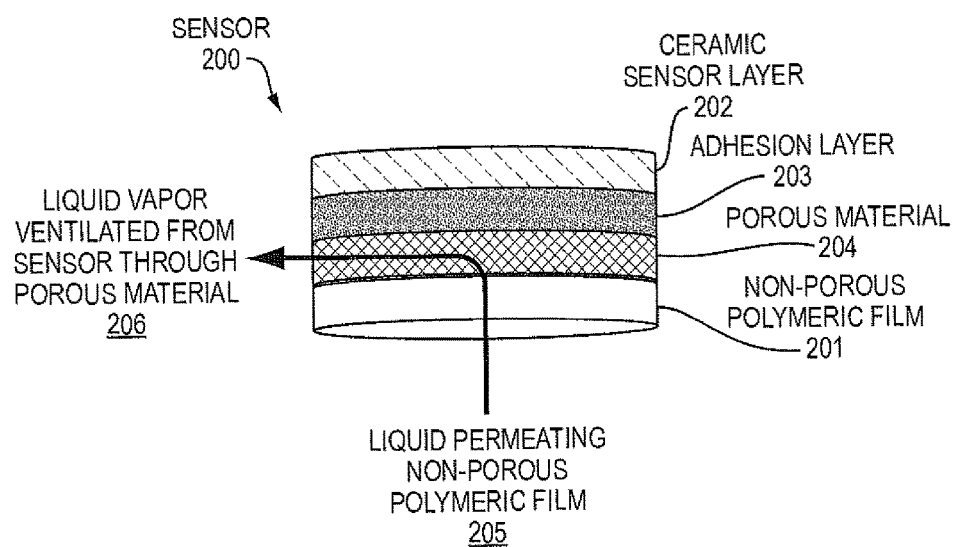
FIG. 2 is a side view of a sensor structure including a porous material, in accordance with a version of the invention.

FIG. 2 is a side view of a sensor structure 200 including a porous material, in accordance with a version of the invention. The non-porous polymeric isolator film 201 is bonded to the porous polymeric material 204; the porous polymeric material 204 is bonded to the adhesion layer 203 (no channels shown) overlaying the liquid facing surface of the ceramic sensor layer 202. Liquid 205 is illustrated permeating the non-porous polymeric film, and the liquid vapor 206 can be vented through the porous polymeric material 204 through pathways (pores) from the sensor 200 to a weep hole or other passage and removed from a sensor housing (not shown). The adhesion layer 203 may also be patterned (see for example FIG. 3 and FIG. 4) in some versions. In other versions the porous material 204 is bonded to one or more portions of the adhesion layer 203 to form pathways to vent vapor or gas from the sensor. Polymers for the porous material layer 204 (as well as for the isolator film 201) can be those used in semiconductor fluid handling and filtration devices. For example, the polymer or polymers can be fluoropolymers, PEEK (polyether ether ketone), PEK (polyether ketone), polyether sulfone, ultra high molecular weight polyethylene, or combinations of these polymers. The porous material 204 can be a microporous membrane, a non-woven, or a web; such as a polymeric microporous membrane or a polymeric web.

Figure 3:
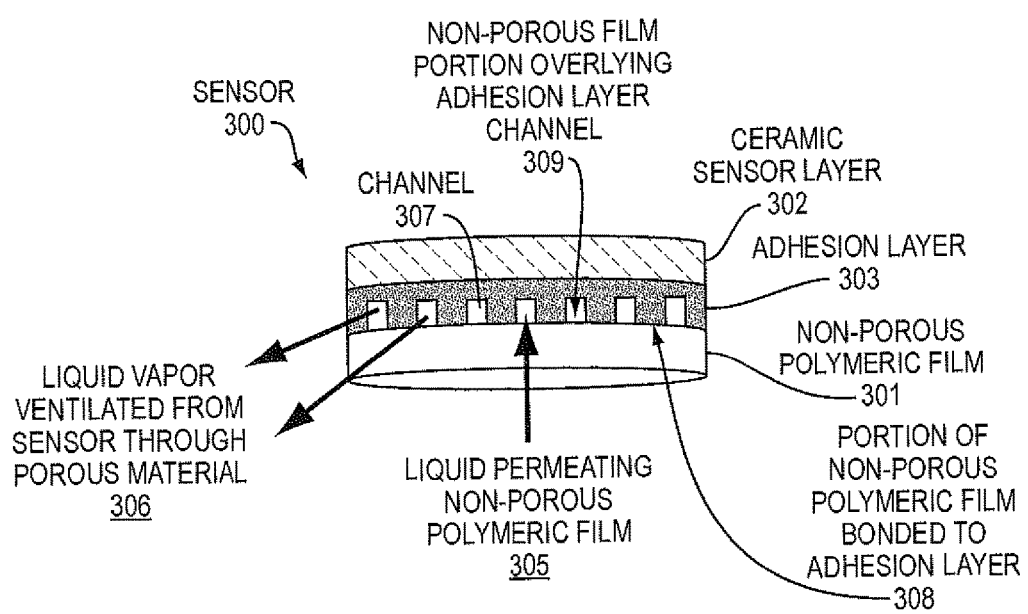
FIG. 3 is a side view of a sensor structure including an adhesion layer with channels, in accordance with a version of the invention.

FIG. 3 is a side view of a sensor structure 300 including an adhesion layer with channels 303, in accordance with a version of the invention. The non-porous polymeric isolator film 301 is bonded to portions 308 of the adhesion layer (non-bonded portions 309 over channels also shown) overlaying the liquid facing surface of the ceramic sensor layer 302. Liquid 305 that permeates through the non-porous polymeric film 301 can be vented 306 from the sensor 300 through the channels 307 to a weep hole or other passage in a sensor housing (housing and weep holes not shown). Channels 307 may be independent or interconnected. The channels 307 may be etched into an adhesion layer 303, or may also be formed by depositing a patterned layer atop an initially flat adhesion layer.

Figure 4A:
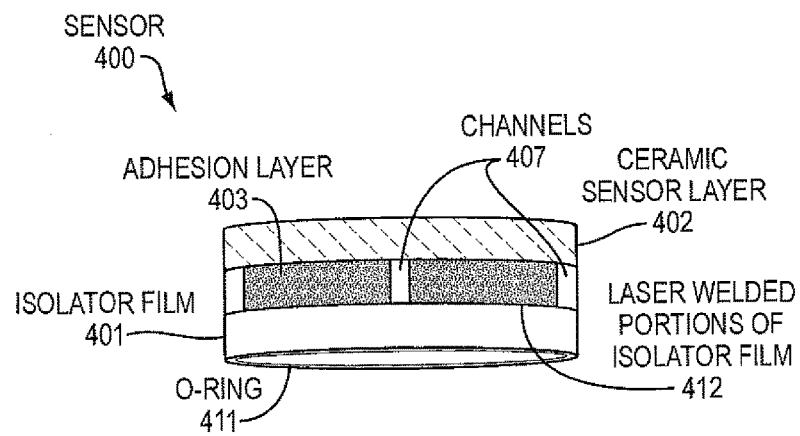
FIGS. 4A and 4B are a side view and a top view (respectively) of a sensor structure including interconnected channels and an O-ring that may be used to seal the sensor in a housing, in accordance with a version of the invention.
Figure 4B:
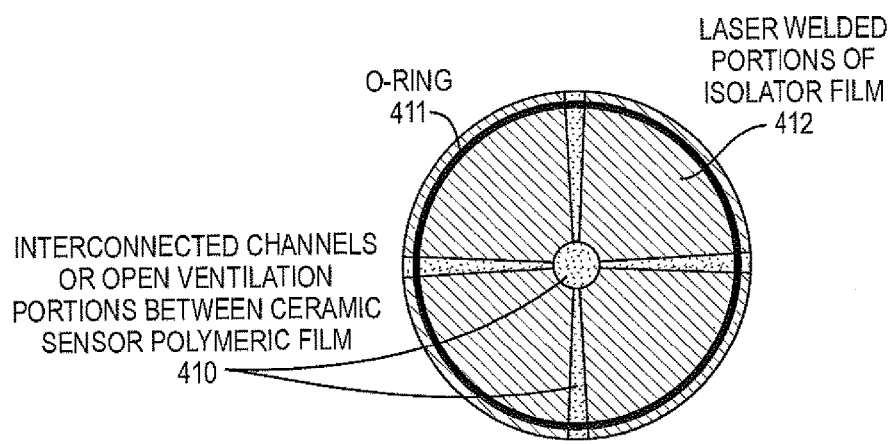

FIGS. 4A and 4B are a side view and a top view (respectively) of a sensor structure 400 including interconnected channels 410 and an O-ring 411 that may be used to seal the sensor 400 in a housing, in accordance with a version of the invention. FIGS. 4A and 4B also illustrate a version of a sensor structure 400 in which a non-porous polymeric isolator film 401 is bonded to portions of the adhesion layer 403 overlaying the liquid facing surface of the ceramic sensor layer 402. Liquid that permeates through the non-porous polymeric film can be vented from the sensor through the channels 407 to a weep hole or other passage in a sensor housing (housing and weep holes not shown). Channels 407 are shown in a non-limiting example as being interconnected 410. The channels 407 may be etched into an adhesion layer 403, or may also be formed by depositing a patterned layer atop an initially flat adhesion layer 403. In this illustration, the channels 407 are patterned to the surface of the ceramic sensor layer 402. The O-ring 411 may be used to seal the sensor 400 in a housing. Compression of the O-ring 411 during sealing with the housing does not completely close the pathways below the isolator film 401 and vapors can still be removed from the sensor 400. The shape, size, open area, and number of pathways below the isolator film 401 can be adjusted to permit venting of vapors for different applications and sealing conditions. In one version, portions 412 of the isolator film 401 are laser welded to bond those portions 412 of the isolator film 401 to an underlying patterned adhesion layer 403. In another version, the polymeric isolator film 401 is bonded directly to one or more portions the ceramic sensor layer 402, the adhesion layer 403 is absent, and pathways for venting vapor that permeates the polymeric isolator 401 are formed.

Figure 5:
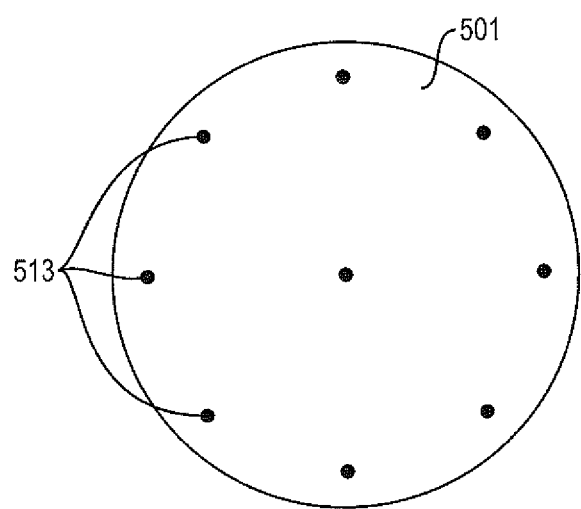
FIG. 5 is a top view of a sensor that uses spot bonding of a polymeric isolator film to an underlying adhesion layer, in accordance with a version of the invention.

FIG. 5 is a top view of a sensor 500 that uses spot bonding of a polymeric isolator film 501 to an underlying adhesion layer (not shown), in accordance with a version of the invention. In one version, the polymeric isolator film 501 is spot bonded 513 directly to the ceramic sensor layer. In an alternative version of the invention, the adhesion layer may be masked to form bonding pads (not shown) on portions of the ceramic sensor layer. Spot bonding 513 using a laser can be made between the polymeric isolator film 501 and the adhesion layer bonding pads; and the unbonded portions of the polymeric isolator film 501 form pathways, in this case vent channels, between the ceramic sensor layer and the polymeric isolator 501.

In one version of the invention, a method of manufacturing comprises, first, pretreating the sensor element. For example, ceramic sensors may be ultrasonically cleaned in acetone and isopropyl alcohol. The parts are loaded into a magnetron sputtering tool. In one example, the system is pumped to 1e-6 torr, and the parts are sputter etched in argon using 13.56 RF power, 10 mtorr argon, 600V DC offset voltage for 10 minutes. The parts are then deposited on one face with 30 to 60 nanometers (nm) of 99.9% chromium using magnetron sputtering. For example, 5 mtorr argon and 1200 Watts DC power may be used. Other techniques of pretreatment may be used, such as heat treatment, ion bombardment and ultraviolet treatments. Also, other methods of deposition may be used, such as RF diode sputtering or any physical vapor deposition method, including evaporation. Subsequently, a fluoropolymer or other type of isolator film is layered on top of the chromium adhesion layer, which may be performed by any of several techniques taught herein. For example, in one version a fluoropolymer isolator film is sprayed and sintered onto the chromium adhesion layer. A dispersion of fluoropolymer particles is sprayed onto the adhesion layer, and then sintered. Each sintering layer may be about 0.5 mil (0.0005 inch) thick, and may be repeated up to about 5 mils (0.005 inch) thick of fluoropolymer film. Alternatively, injection molding, lamination, laser bonding and/or adhesive bonding of the isolator film may be used.

Figure 6:
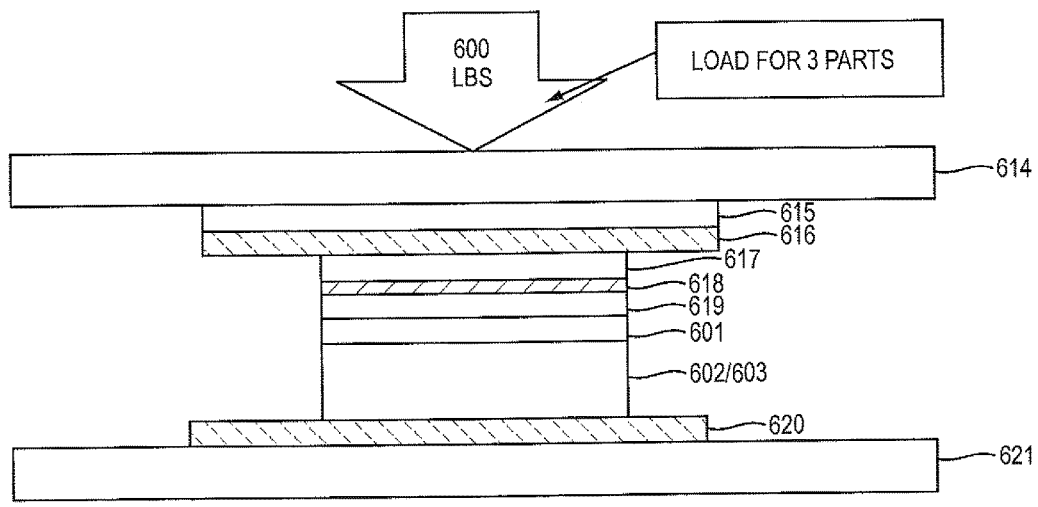
FIG. 6 is a diagram of a method of laminating an isolator film to a chromium adhesion layer on a sensor, in accordance with a version of the invention.

FIG. 6 is a diagram of a method of laminating an isolator film to a chromium adhesion layer on a sensor, in accordance with a version of the invention. In one version, a Carver press may be used, as shown in FIG. 6. For example, 3 to 5 samples at a time may be prepared in a triangle or hexagonal pattern. 200 Pounds per Square Inch (PSI) pressure may be used per part (600 to 1000 lbs ram force). A heating cycle may, for example, be used as follows: 212° C. for PCTFE; 295° C. for FEP; and 385° C. for PFA. A 30 minute soak may be used, with a slow cool to room temperature. As shown in FIG. 6, the stack includes, from top to bottom, a heater platen 614, a compliant layer 615, a ceramic flat 616, a compliant layer 617, an aluminum foil layer 618, a silicon or quartz replication wafer 619, a fluoropolymer isolator film 601 (such as FEP, PFA, PTFE or PCTFE), a sensor with adhesion layer 602/603, a ceramic flat 620 and a heater platen 621. The heater platens 614 and 621 are the top and bottom platens of the Carver press, respectively. The compliant layer 615 comprises grafoil or ceramic paper, which helps to distribute the load. The ceramic flats 616 and 620 are, for example, 6 inch diameter alumina plate to provide a flat uniform loading surface. The compliant layer 617 may be grafoil or ceramic paper for load distribution. The aluminum foil layer 618 is a release layer, which prevents sticking. The silicon or quartz replication wafer 619 is a flat and polished disk coated with Frecote release agent. The polished surface keeps the laminated film smooth and flat. The fluoropolymer isolator film 601 may, for example, be about 0.001 inches thick or less.

Figure 7:
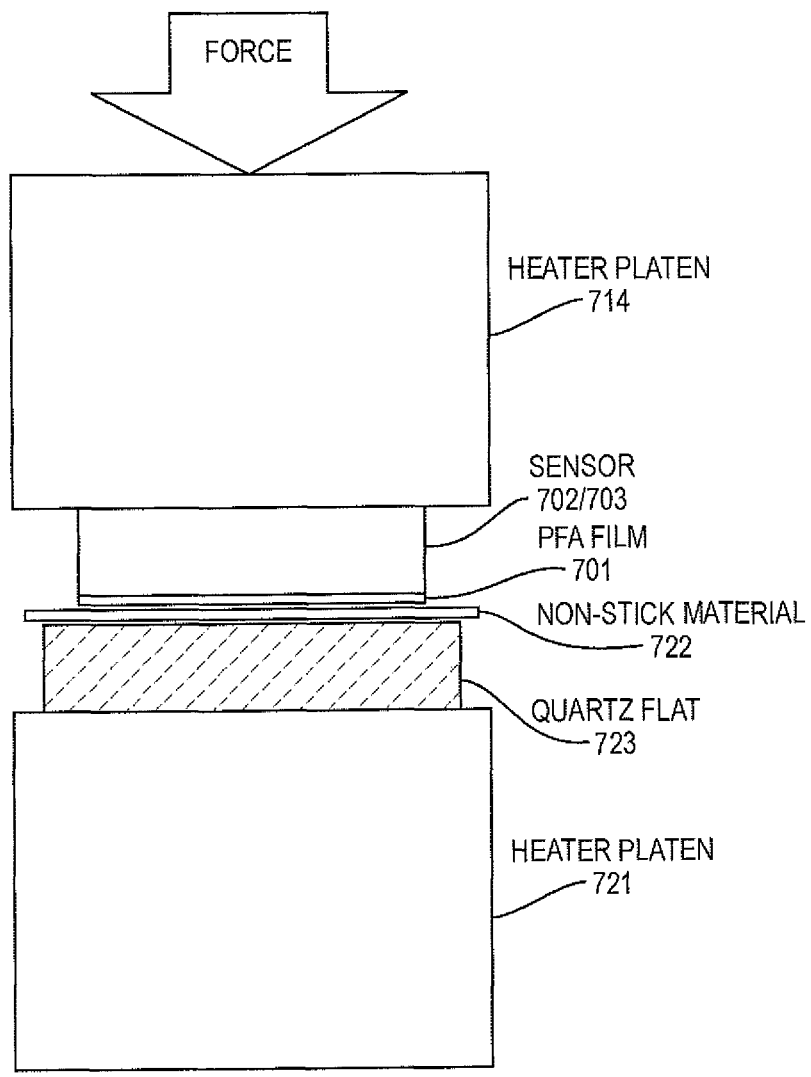
FIG. 7 is a schematic drawing of another method of laminating an isolator film to a chromium adhesion layer on a sensor, in accordance with a version of the invention, in which a single sensor resistive heating system is used.

FIG. 7 is a schematic drawing of another method of laminating an isolator film to a chromium adhesion layer on a sensor, in accordance with a version of the invention, in which a single sensor resistive heating system is used. The method is somewhat simpler than the method of FIG. 6, because the lamination system can distribute force evenly using springs, and thus a compliant layer need not be used. In the method of FIG. 7, the following components are used in the compression stack, from top to bottom, with compressive force being applied at the top of the stack: a heater platen 714, sensor 702/703, an isolator film 701, a non-stick material 722 (such as Kapton® film, sold by E. I. du Pont de Nemours and Company of Del., U.S.A., or Frekote 55-NC, sold by Henkel AG & Company, KGaA of Dusseldorf, Germany), a quartz flat 723 and a heater platen 721.

There may, however, be drawbacks of laminating with a compression molding press, as in the versions of FIGS. 6 and 7. This is a slow process that requires heating the entire sensor to the melting temperature of the fluoropolymer, which can exceed 300° C. Heating sensor substrates to such high temperatures can damage the solder and electronic components of the sensors which are mounted on the side of the sensor opposite the liquid facing surface.

Thus, in another version of the invention, laser welding of polymeric films to a ceramic substrate or an adhesive layer atop a ceramic substrate allows a polymeric isolator film to be locally melted in the vicinity of the sensor surface, but does not heat up the entire sensor. Laser welding also allows portions of the polymeric isolator film to be bonded to the underlying ceramic or adhesive layer while other portions can be left unbonded. Partially bonding the polymeric isolator film allows vent channels to be formed below the polymeric isolator, which can allow permeated vapors, for example water vapor, to be ventilated or purged from below the isolator.

Figure 8:
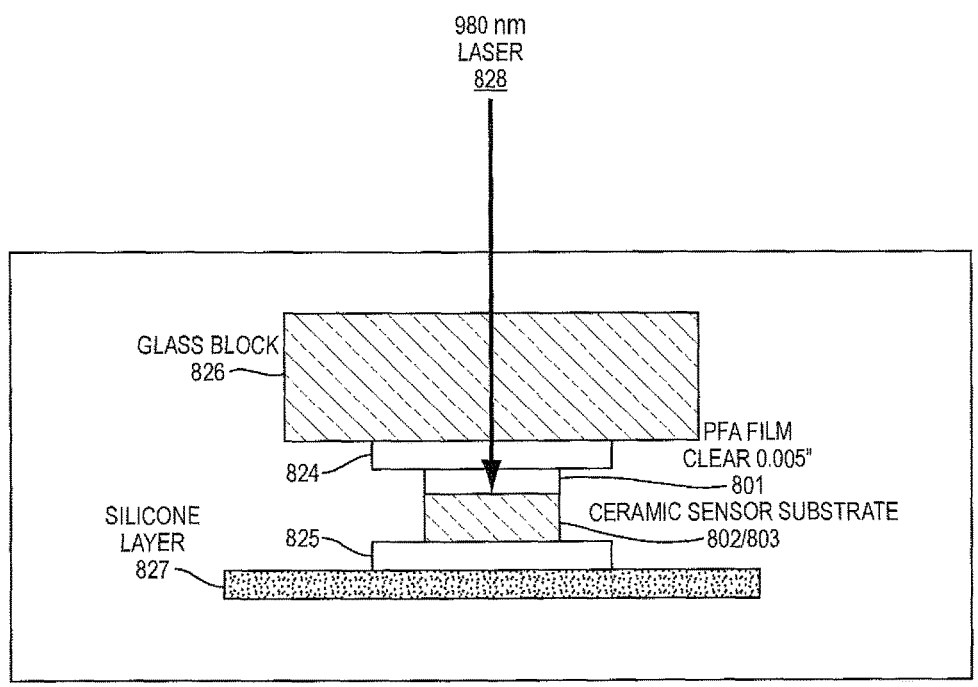
FIG. 8 is a schematic drawing of another method of laminating an isolator film to a chromium adhesion layer on a sensor, in accordance with a version of the invention, in which laser lamination is used.

FIG. 8 is a schematic drawing of another method of laminating an isolator film to a chromium adhesion layer on a sensor, in accordance with a version of the invention, in which laser lamination is used. Non-stick films 824, 825, such as Kapton® films, are used in the lamination stack. One non-stick film 824 is placed between a glass block 826 and the isolator film 801, such as a PFA clear film, above the sensor face 802/803, and a second non-stick film 825 is placed between the bottom of the ceramic sensor and a silicone layer 827 that make up the base layer of the lamination stack. The glass block 826 is used to distribute force and, along with the press, provide laminating pressure between the isolator film 801 and the face of the sensor 802/803, which is heated by the laser 828.

In one version of the invention a non-porous or dense polymeric film is bonded to an adhesion layer that overlies the liquid facing surface of a ceramic sensor layer. The polymer isolator film can be bonded by laser welding. Laser welding can be used to bond substantially the entire polymeric film to the adhesion layer, or in some embodiments, laser welding can be used to bond portions of the polymeric film while other portions are not bonded. The unbonded portions of the polymeric film can form vent channels between the surface of the adhesion layer and the underside of the polymeric isolator film.

The laser beam used to bond the non-porous or dense polymeric film can have a large beam spot or a narrow beam spot. Larger beam spots can be used to uniformly heat an area of interest on the polymer film. Alternatively, a narrower beam spot laser can be rastered across the polymeric film to bond the film, and can further minimize heating and provide flexibility in the welding protocol.

In some versions of the method of making the polymer film coated sensor, a specific wavelength of laser that is absorbed more strongly by, for example, a fluoropolymer polymeric film can be used; or a light absorber, such as carbon black, can be added to the fluoropolymer to make it absorb more strongly.

In some versions the adhesion layer can be masked on the liquid facing side of the sensor such that some portions of the ceramic sensor are coated with the adhesion layer and some portions of the ceramic sensor are uncoated. In one version of the invention, the overlaying non-porous or dense polymeric film can be bonded only to those portions of the ceramic sensor where the adhesion layer is present using a rastered laser, and left unbonded at portions where the adhesion layer is not present (for example by turning off the laser). The unbonded portions of the polymeric isolator film can provide one or more pathways, in this case channels, that allow vapor permeating through the polymeric film layer to be vented to a tube or weep hole and remove the vapor from a housing that contains the sensor.

In some versions of the invention, a raster type laser welding technology can be used to melt bond a non-porous fluoropolymer film over the entire surface of the sensor, and can also be used to selectively weld a portion of the film to the sensor surface. This partially welded film provides ventilation paths for chemical permeates to escape. The ventilation path or channel patterns can be varied to balance adhesion, isolator deformation and interstitial flow of gases and vapors.

Figure 9:
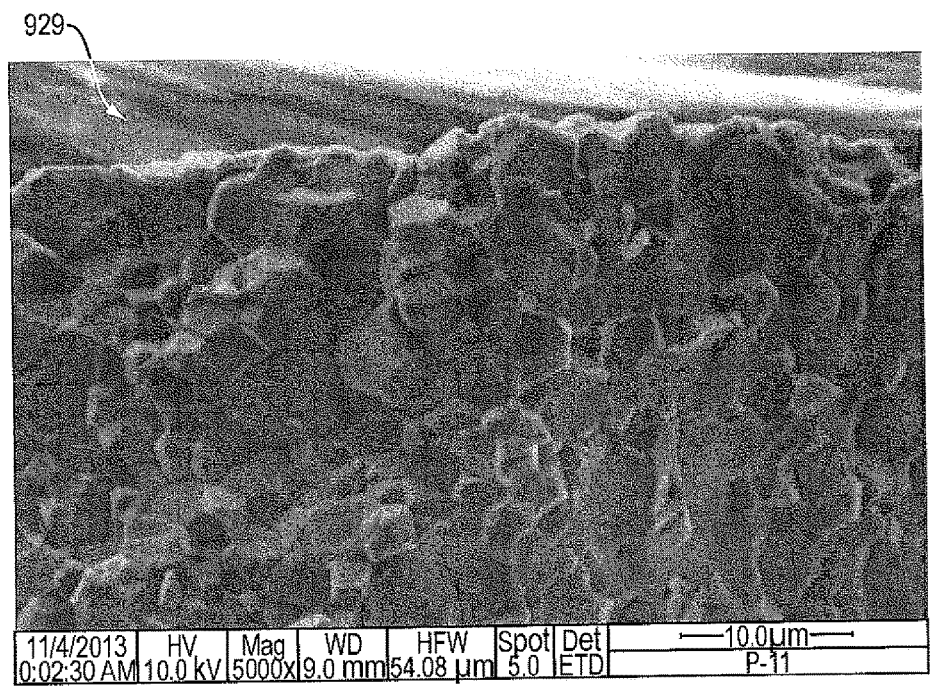
FIG. 9 is a scanning electron microscope (SEM) cross section image of a PFA film laminated on an $Al_2O_3$/Cr sensor surface, in accordance with a version of the invention.

Without wishing to be bound by physical theory, it is believed that lamination of an isolator film, such as a PFA film, to an adhesion layer coated ceramic sensor, such as $Al_2O_3/Cr$, occurs mechanically by the melted isolator film, such as PFA, flowing into the microstructure of the ceramic surface. Thus, in one version, at least a portion of the isolator film is infiltrated into microstructure openings in a surface of the adhesion layer. FIG. 9 is a scanning electron microscope (SEM) cross section image of a PFA film 929 laminated on an $Al_2O_3/Cr$ sensor surface, in accordance with a version of the invention. Such a scanning electron microscope image may be used to determine whether the isolator film has infiltrated into microstructure openings in a surface of the adhesion layer. In addition, it is believed that such infiltration is facilitated by a thin isolator film, in particular one with a final film thickness of less than about 0.001 inches. Thus, in one version, the isolator film comprises a thickness of less than about 0.001 inches. The ability of the isolator film, such as PFA, to flow "wet" the substrate is dependent on temperature, pressure and time. Thus, it is believed that greater success rates of bonding of the isolator film to the adhesion layer are found when higher process times and temperatures are used. The process temperature is believed to be inversely proportional to blister formation (a failure of the isolator film bonding), with the minimum temperatures required being greater than the melting point of the polymer for the isolator film (for example, about 300 C for PFA polymer). The process time is believed to be inversely proportional to blister formation, with minimum heating times, above the melting point of the isolator film polymer, being greater than 10 minutes. Thus, in one version, one or more portions of the isolator film are bonded to the adhesion layer by thermal lamination at a temperature greater than about 300 C for at least about 10 minutes. In addition, blister formation is believed to be inversely proportional to surface roughness (Ra or rms), since it is believed that, because the isolator film can flow more readily into surface features on a rougher surface, increased performance results from a rougher surface. Thus, in one version, the adhesion layer comprises a surface roughness of greater than about 0.7 micrometers roughness average (Ra) and greater than about 0.8 micrometers roughness root mean squared (rms) prior to application of the isolator film; for example, between about 0.7 and about 0.9 micrometers Ra or between about 0.8 and about 1.2 micrometers rms. In addition, it is believed that longer cooling times after thermal lamination reduce blister formation. Thus, in one version, one or more portions of the isolator film are bonded to the adhesion layer by thermal lamination followed by cooling for at least about 30 minutes.

In another version, an adhesive may be used to bond a composite structure, which includes an isolator film and a porous membrane, to an underlying chromium adhesion layer of a ceramic structure. For example, a soft adhesive may be used to prevent delamination or blistering of the isolator film. Adhesives such as cyanoacrylate type adhesives, silicone adhesives and epoxy adhesives may be used. A thickness of, for example, less than about 0.002 inches of an isolator film, such as a PFA film; and a thickness of, for example, less than about 0.002 inches of a porous membrane, such as a PTFE membrane, may be used; with one or more of such adhesives bonding the porous membrane to the isolator film and to the adhesion layer of the underlying ceramic structure.

General Experimental

General Set-up: Lamination set-ups as shown in FIGS. 6 and 7 were used for thermal laminations, and, for laser lamination, the set-up as shown in FIG. 8.

Sensors: Two types of sensors were used in the trials: one type made by Kavlico Sensors of Moorpark, Calif., U.S.A., and the other type made by Endress+Hauser, Inc. of Greenwood, Ind., U.S.A. (here, "E&H"). Both sensor surfaces are made of $Al_2O_3$. The E&H sensors came in two variations of $Al_2O_3$ purity, 96.0% and 99.0%. All the sensors were coated with approximately 1500 to 3000 angstroms of Cr (5 min) by vapor deposition. The Cr was used to protect the $Al_2O_3$ against degradation.

TABLE 1

Sensor Types

| Sensor | $Al_2O_3$ | Coating |
| --- | --- | --- |
| Kavlico | 96.0% | Sputtered Cr (5 min) |
| E & H | 96.0% | Sputtered Cr (5 min) |
| E & H | 99.9% | Sputtered Cr (5 min) |

Isolator: PFA (Perfluoroalkoxy), which is a fluoropolymer that melts at ~305 C/586 F. Most of the lamination samples used 0.005" thick (initial thickness), (grade 350) PFA purchased from American Durafilm. A few samples were made with 0.001" and 0.020" PFA initial thickness.

Experimental #1

In a process sequence in accordance with the version of FIG. 6, the sensors are first cleaned with acetone/IPA ultrasonically. The films are cut in circles about 0.125 inches larger than the sensor. The replication wafers are treated with Frecote. Three (or another number of) sensors are loaded in stacks as shown in FIG. 6. 500 lbs of ram force is applied. The temperature is ramped to soak temperature (with the pressure rising to 600 lbs) for approximately 2 hours. The lamination is soaked for 30 minutes, during which time the pressure may rise to 1100 lbs due to heating of the hydraulics. The heater is turned off, and the lamination is allowed to cool slowly, for about 5 hours. Excess film is trimmed from the edges with blades. The polymer is acid cleaned, for example with dilute nitric acid.

Sensors treated in this way have been subjected to long soak times in 85° C. deionized water, without evidence of delamination after at least 3 weeks. As used herein, such results are indicated as passing the "hot DI water test."

Experimental #2

Figure 10:
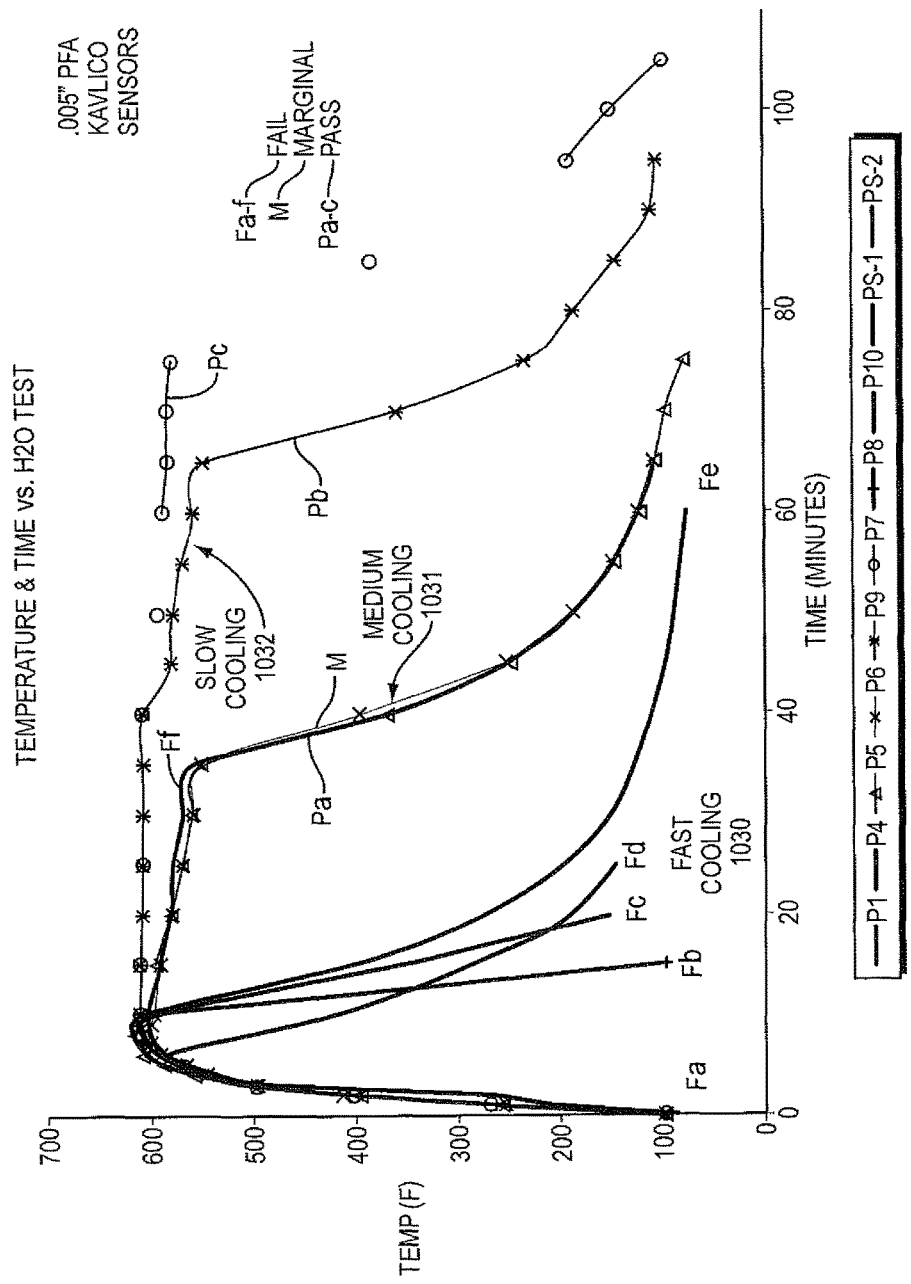
FIG. 10 is a graph illustrating process time and temperature versus passing a hot water test of not delaminating in 85° C. water, in an experiment in accordance with a version of the invention.

A series of samples were run using Kavlico sensors. These tests were run at relatively lower temperatures (610 Fahrenheit), and were designed to understand the effect of heating time on function. Ramp down rates were also varied after heating. This was accomplished by stepping down the temperature at the tail end of heating instead of turning the controller off. FIG. 10 is a graph illustrating process time and temperature versus passing a hot water test of not delaminating in 85° C. water. Sensors 1030, with "fast cooling" (see traces Fa-f), generally failed the hot DI water test; sensors 1031, with "medium cooling" (see trace M), were marginal; and sensors 1032, with "slow cooling" (see traces Pa-c) generally passed the test. This demonstrates that longer process times, such as a cooling time of greater than about 30 minutes, improves the chances for passing the hot water test.

Experimental #3

Figure 11:
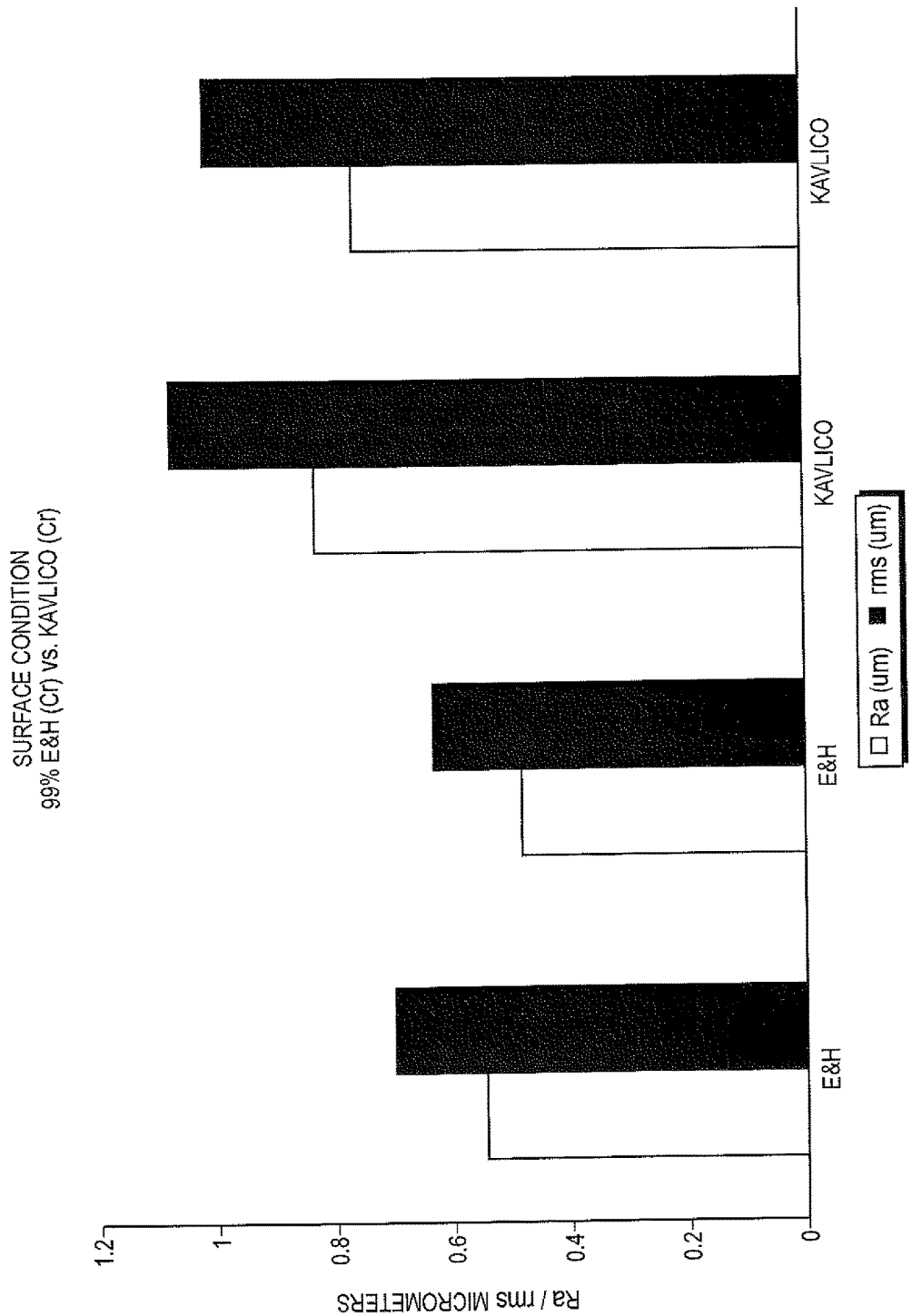
FIG. 11 is a graph of measured surface roughness for sensors in accordance with a version of the invention.

Surface roughness was determined for two sets of samples of each of the E&H 99% alumina sensors, and the Kavlico sensors, both with chromium adhesion layers. FIG. 11 shows surface roughness measures for these sensors. The E&H 99% sensors had surface roughness average (Ra) less than about 0.7 micrometers, whereas the Kavlico sensors had Ra surface roughness greater than 0.7 micrometers. The E&H 99% sensors had Root Mean Square (RMS) surface roughness less than about 0.8 micrometers, whereas the Kavlico sensors had RMS surface roughness greater than about 0.8 micrometers.

Experimental #4

Table 2 is a table showing processing temperature and time data from experiments in accordance with the general experimental setup described above.

TABLE 2

Sensor Type versus Minimum Processing Temperature and Time

| Sensor | Min Temp. | Min Time | % Passing Test | Sample Size |
|---|---|---|---|---|
| Kavlico | 610 F. | 35 min | 100% | 13 |
| 96% E&H | 675 F. | 20 min | 100% | 5 |
| 99% E&H | 725 F. | 35-60 min | 78% | 9 |

The data shows that Kavlico and 96% E&H sensors can be successfully laminated at lower temperatures and shorter times than 99% E&H sensors. Taken in conjunction with the surface roughness measures of Experimental #3, this suggests that surface roughness is a factor in the ability to pass the hot DI water test, since E&H 99% sensors with a smoother surface require more time/temperature than the rougher surfaced Kavlico and E&H 96% sensors.

Experimental #5

In a process sequence in accordance with the embodiment of FIG. 8, Alumina sensors sold by Endress+Hauser, Inc. of Greenwood, Ind., U.S.A., were laminated with PFA films on a chrome layer overlying the sensor. The sensors were laminated using 0.005 inch (127 micrometer) thick clear PFA films. The lamination stack was made with the glass block and Kapton® above the PFA film with the clamping pressure of 25 Pounds per Square Inch (PSI) applied and then irradiated with the 980 nanometer laser through the glass block and Kapton® film for 63 seconds and then left to sit for 5 seconds. The stack was then irradiated for 45 seconds and left to sit for 30 seconds with clamp pressure on. After this 30 seconds, the stack was allowed to further cool for 60 seconds with clamp pressure removed, and then the sensor was removed from the stack.

Sensors treated in this way have been subjected to long soak times in 85° C. deionized water, without evidence of delamination after at least 3 weeks.

Experimental #6

Table 3 provides results of an experiment testing sensors in accordance with a version of the invention. Columns of the chart from left to right represent a sensor serial number; a lamination type, with reference to FIGS. 6-8 above; a date a sensor was placed into a hot water test; a date a sensor was removed from the hot water test; material, thickness, and other notes; inspection notes after hot water testing; a final film thickness after lamination and prior to hot water testing; and an estimated time to fail in days. It can be seen, from the first three rows, that better results were found for a film thickness of less than about 0.001 inches, with a laser lamination. Likewise, it can be seen from the fourth and fifth rows that acceptable results were found with a film thickness of less than about 0.001 inches, with thermal laminations according to FIGS. 6 and 7.

TABLE 3

Results of Hot DI Water Tests

| Serial Number | Lamination Type | Date Started Hot Water Test | Date Removed from Hot Water Test | Material, thickness, other notes | Inspection Notes after Hot Water Testing | Film Thickness (final) | Estimated Time to Fail (Days) |
|---|---|---|---|---|---|---|---|
| L011 | Laser (FIG. 8) | Jun. 25, 2013 | Oct. 8, 2013 | Cr over Kavlico + 0.005"PFA | Jul. 2, 2013 - Inspected after 7 days in hot water. No change. Jul. 19, 2013 - no change. Jul. 29, 2013 bubbling around inside of oring mark. Aug. 20, 2013 - looks like a few of the small bubbles around oring burst/peeling. Everything else looks good Aug. 30, 2013 - no change, looks good. | Film ~.001" thick | <34 |

TABLE 3-continued

Results of Hot DI Water Tests

| Serial Number | Lamination Type | Date Started Hot Water Test | Date Removed from Hot Water Test | Material, thickness, other notes | Inspection Notes after Hot Water Testing | Film Thickness (final) | Estimated Time to Fail (Days) |
|---|---|---|---|---|---|---|---|
| L3-13 | Laser (FIG. 8) | Sep. 30, 2013 | Oct. 8, 2013 | .005 PFA on Cr Kavlico Sensor | Sep. 24, 2013 - no change Oct. 8, 2013 - Small blisters same around o-ring, very large rough section. Sampled pulled for thickness and DSC. Oct. 7, 2013 - two blisters near center; no contamination observed in blisters. Oct. 8, 2013 - Sample looks the same, blisters noted before are very small and may be associated with dents. Sample pulled for DSC and thickness testing. | Film .003" thick | <7 |
| L3-24 | Laser (FIG. 8) | Oct. 2, 2013 | Oct. 8, 2013 | ~4 dark areas, sample cleaner than most others | Oct. 8, 2013 - Blisters after 1 day. Sampled pulled from hot water loop for DSC and thickness testing. | Film .004" thick | <2 |
| 012 | Thermal (FIG. 6) | Mar. 20, 2013 | Oct. 8, 2013 | Cr over Kavlico + 0.005"PFA | Oct. 8, 2013 Sample looks good, no blisters. Sample pulled from hot water loop for thickness and DSC testing. | Film <.001" thick | >210 |
| PR-4 | Thermal (FIG. 7) | Nov. 19, 2013 | Dec. 30, 2013 | Quartz/kapton disc/.005" PFA/96% E&H/635F −15 psig 20 min | Nov. 20, 2013 OK. Nov. 22, 2013 OK. Nov. 25, 2013 OK. Dec. 2, 2013 OK. Dec. 11, 2013 OK. 12-19 OK Dec. 30, 2013 OK. Removed to make room/pass | 0.0008 | 42 (days without failure) |

Experimental #7

In an experiment to evaluate the use of adhesives, two types of sensor assemblies were made, both using a thickness of about 0.002 inches of a PFA film, and a thickness of about 0.002 inches of a porous PTFE membrane. In each type, an adhesive was used to bond the porous membrane to the isolator film and to the adhesion layer of the underlying ceramic structure. In one type, a silicone adhesive was used, and in the other type, a cyanoacrylate adhesive (Loctite® 380™, sold by Henkel AG & Company, KGaA of Dusseldorf, Germany) was used. In both types, the combination did not show any blister or failure after more than two months under hot water, and after more than one month under 36% HCl, 30% $NH_4OH$ and 30% $H_2O_2$.

Experimental #8

An experiment was performed to determine indirectly whether open channels (which may permit venting) are found in an adhesively bonded isolator film with porous membrane (here, a "composite" structure). The composite structure is initially white due to the presence of open pores in the porous membrane. However, if the composite is wet by isopropyl alcohol (IPA), the whole isolator turns almost transparent. In a test, adhesively bonded composite structures were placed in a test assembly so that the isolator surface could be seen. Initially, the isolator surface was white. The test assembly was then filled with IPA. The isolator surface changed to be transparent, and the underlying chromium coated adhesion layer could be seen. In another test, in the cyanoacrylate adhesive type of sensor assembly of Experimental #7, above, it was found that the composite isolator film structure appeared white even after the hot water test, and it is therefore believed that open channels were still present in the porous membrane.

Figure 12:
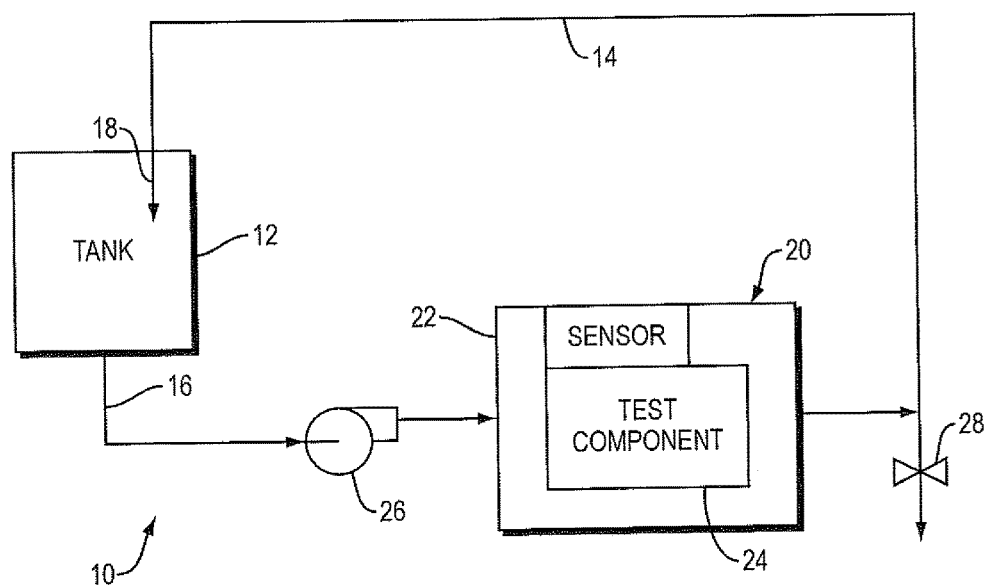
FIG. 12 is a schematic diagram of a test set-up that can be used for a hot DI water test for sensors in accordance with a version of the invention.

FIG. 12 is a schematic diagram of the test set-up 10 that can be used for a hot DI water test. In FIG. 12, one or more sensors is mounted in a housing (not shown) that is inserted into a test component 24 within test unit 20/22, and water is recirculated from a water heater, which includes tank 12 and pump 26, in a closed loop through lines 14/16/18 (at 85° C.) past the sensors. The sensors are removed weekly and visually inspected for delamination. The sensors can be reinstalled and tested to failure. Valve 28 helps to vent bubbles from the system.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features and/or elements depicted herein are illustrated with particular dimensions and/or orientations relative to one another for purposes of simplicity and ease of understanding, and that the actual dimensions and/or orientations may differ substantially from that illustrated herein.

Although the present invention has been described in considerable detail with reference to certain versions thereof, other versions are possible. Therefore the spirit and scope of the appended claims should not be limited to the description and the versions contain within this specification.

The teachings of all patents, published applications and references cited herein are incorporated by reference in their entirety.

What is claimed is:

1. A sensor, comprising:
    a sensor layer comprising a ceramic material;
    an adhesion layer comprising chromium, the adhesion layer adhered to one or more portions of a liquid facing surface of the sensor layer; and
    an isolator film comprising a polymer, one or more portions of the isolator film being bonded to a liquid facing surface of the adhesion layer.

2. The sensor according to claim 1, wherein the adhesion layer comprises at least one of: a chromium alloy and chromium oxide.

3. The sensor according to claim 1, wherein the adhesion layer comprises a chromium platinum alloy.

4. The sensor according to claim 1, wherein the adhesion layer comprises chromium of a purity of at least 99.9%.

5. The sensor according to claim 1, wherein the adhesion layer comprises a thickness of between about 10 nanometers (nm) and about 2 microns.

6. The sensor according to claim 1, wherein the adhesion layer comprises a thickness of between about 30 nanometers (nm) and about 60 nanometers (nm).

7. The sensor according to claim 1, wherein the adhesion layer comprises a physical vapor deposition deposited layer.

8. The sensor according to claim 1, wherein the adhesion layer is at least one of affixed and bonded to the liquid facing surface of the sensor layer.

9. The sensor according to claim 1, wherein the ceramic material comprises alumina.

10. The sensor according to any one of claim 1, wherein the sensor layer comprises between about 93% and about 96% alumina.

11. The sensor according to claim 1, wherein the sensor layer comprises between about 96% alumina and about 99.8% alumina.

12. The sensor according to claim 1, wherein the isolator film comprises a fluoropolymer.

13. The sensor according to claim 1, wherein the isolator film comprises at least one of perfluoroalkoxy (PFA), fluorinated ethylene propylene (FEP), polytetrafluoroethylene (PTFE) and polychlorotrifluoroethylene (PCTFE).

14. The sensor according to claim 1, wherein the isolator film comprises at least one of a laminated fluoropolymer film, an injected molded fluoropolymer film, and a sprayed and sintered fluoropolymer film.

15. The sensor according to claim 1, wherein the isolator film comprises a thickness of between about 0.001 inches and about 0.005 inches.

16. The sensor according to claim 1, wherein the sensor constitutes at least one of a liquid pressure sensor, a flow sensor and a viscosity sensor.

17. The sensor according to claim 1, wherein the sensor is configured to be placed in deionized water at a temperature between about 85° C. and about 100° C.

18. The sensor according to claim 1, wherein the bond between the one or more portions of the isolator film and the adhesion layer is characterized by no visible blisters being formed between the isolator film and the adhesion layer after exposing the sensor sealed in a housing to hot deionized water at a temperature of between 85° C. and 100° C. for at least 3 weeks.

19. The sensor according to claim 1, wherein one or more portions of the isolator film are bonded to the adhesion layer by thermal lamination.

20. The sensor according to claim 1, wherein one or more portions of the isolator film are bonded to the adhesion layer by thermal lamination at a temperature greater than about 300 C for at least about 10 minutes.

21. The sensor according to claim 1, wherein one or more portions of the isolator film are bonded to the adhesion layer by thermal lamination followed by cooling for at least about 30 minutes.

22. The sensor according to claim 1, wherein the isolator film comprises a thickness of less than about 0.001 inches.

23. The sensor according to any one of claim 1, wherein at least a portion of the isolator film is infiltrated into microstructure openings in a surface of the adhesion layer.

24. The sensor according to claim 1, wherein one or more portions of the isolator film are bonded to the adhesion layer by laser welding.

25. The sensor according to claim 1, wherein the adhesion layer comprises a surface roughness of greater than about 0.7 micrometers roughness average (Ra) and greater than about 0.8 micrometers roughness root mean squared (rms) prior to application of the isolator film.

26. A sensor, comprising:
    a sensor layer comprising a ceramic material;
    an adhesion layer comprising chromium, the adhesion layer adhered to one or more portions of a liquid facing surface of the sensor layer;
    an isolator film comprising a polymer, one or more portions of the isolator film being bonded to a liquid facing surface of the adhesion layer; and
    a porous polymeric material between the isolator film and the adhesion layer.

27. The sensor according to claim 26, further comprising an adhesive bonding the isolator film to the porous polymeric material.

28. A sensor, comprising:
    a sensor layer comprising a ceramic material;
    an adhesion layer comprising chromium, the adhesion layer adhered to one or more portions of a liquid facing surface of the sensor layer;
    an isolator film comprising a polymer, one or more portions of the isolator film being bonded to a liquid facing surface of the adhesion layer; and
    one or more vent pathways that vent gas or vapor from the sensor.

29. The sensor according to claim 28, further including one or more vent pathways between the isolator film and the adhesion layer.

* * * * *